United States Patent [19]

Kvaas

[11] 4,414,040
[45] Nov. 8, 1983

[54] PASSIVATION OF MERCURY CADMIUM TELLURIDE SEMICONDUCTOR SURFACES BY OZONE OXIDATION

[75] Inventor: Robert E. Kvaas, Goleta, Calif.

[73] Assignee: Santa Barbara Reserarch Center, Goleta, Calif.

[21] Appl. No.: 294,670

[22] Filed: Aug. 20, 1981

[51] Int. Cl.³ .............................................. C23C 11/00
[52] U.S. Cl. ....................................... 148/6.3; 427/82
[58] Field of Search ............................ 148/6.3; 427/82

[56] References Cited
U.S. PATENT DOCUMENTS
4,176,206 11/1979 Inoue ..................................... 148/6.3

OTHER PUBLICATIONS

"Sputter Cleaning and Dry Oxiation", Solzbacher Surface Science 97 (1980), pp. 191-205.

Primary Examiner—Sam Silverberg
Attorney, Agent, or Firm—D. W. Collins; G. B. Rosenberg; A. W. Karambelas

[57] ABSTRACT

A process is provided for forming the native oxide on a semiconductor surface comprising $Hg_{1-x}Cd_xTe$, where x ranges from 0 to 1. The process comprises exposing the semiconductor surfce to a mixture of ozone and oxygen containing an effective amount of ozone sufficient to form a native oxide thereon. The desired amount of ozone is conveniently obtained by passing oxygen from a source through an ozone generator provided with a source of high voltage.

7 Claims, 1 Drawing Figure

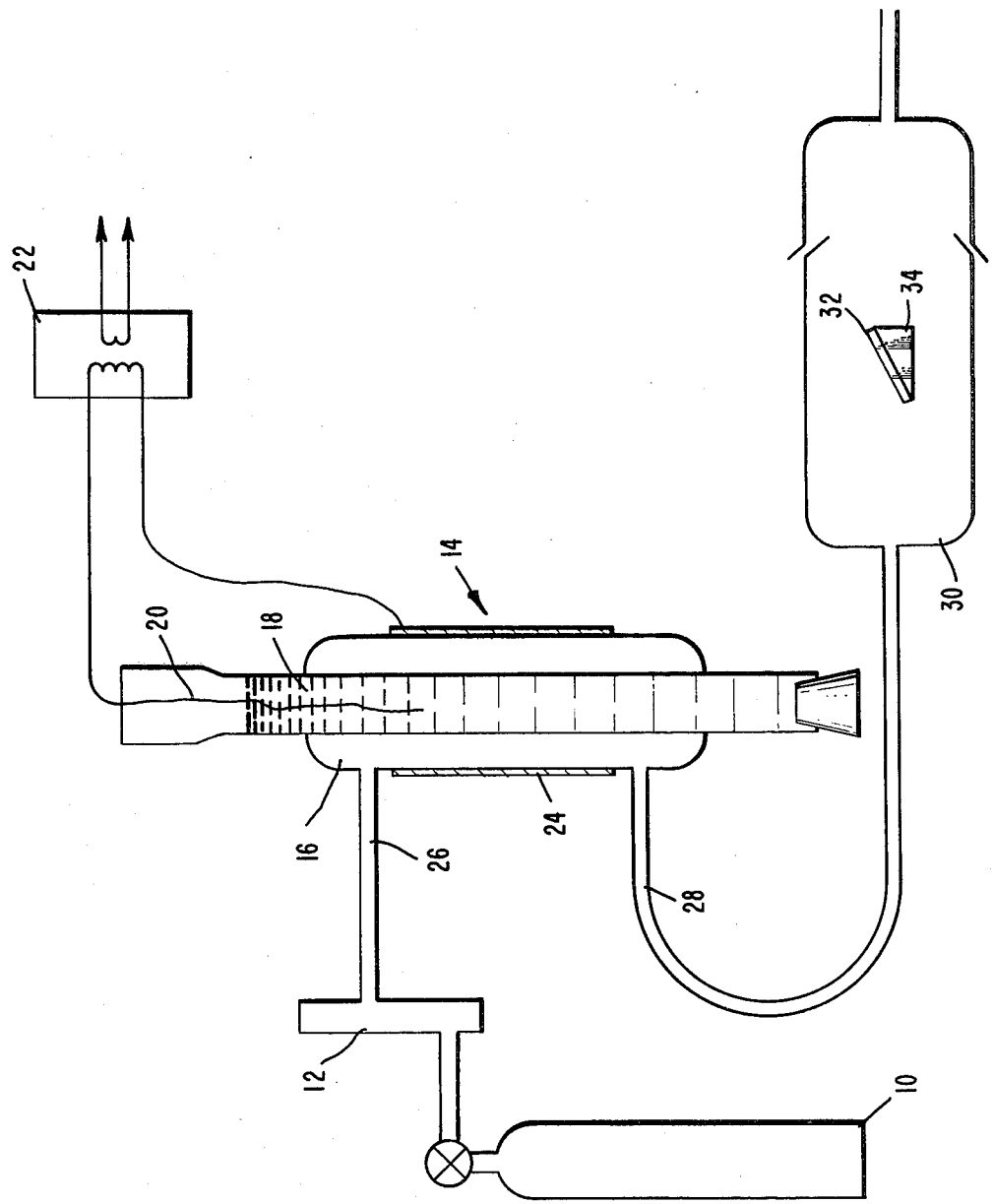

PASSIVATION OF MERCURY CADMIUM TELLURIDE SEMICONDUCTOR SURFACES BY OZONE OXIDATION

BACKGROUND OF THE INVENTION

1. Field of the Invention

This invention relates to formation of a native oxide on mercury cadmium telluride ($Hg_{1-x}Cd_xTe$) semiconductor surfaces and, more particularly, to the formation of a native oxide on such surfaces by ozone oxidation.

2. Description of the Prior Art

In order to fabricate stable, high performance photovoltaic diodes and charge coupled devices (CCDs), certain semiconductor surfaces adjacent insulators require passivation. This passivation is usually accomplished by the growth on the semiconductor surface of a native oxide layer, which has superior chemical and electrical properties compared to surfaces with no native oxide. Complete reaction of all constituent elements of the semiconductor to stable oxidation states is necessary for thermal stability as well as high electrical resistivity. In addition, the bonds between the atoms in this oxide passivation must be strong and complete to prevent residual electric charge or paths for charge conduction. Residual charge can accumulate or invert CCD and diode surfaces, while charge conduction can leak current around diode junctions. Since the native oxide grown for these purposes is usually very thin, it must resist decomposition during the formation of an additional overlying insulator such as ZnS. The passivation process must also be reproducible and reliable.

SUMMARY OF THE INVENTION

In accordance with the invention, a process is provided for forming a native oxide on a semiconductor surface comprising $Hg_{1-x}Cd_xTe$, where x ranges from 0 to 1. The process comprises exposing the semiconductor surface to a mixture of ozone and oxygen containing an effective amount of ozone sufficient to form the native oxide. The ozone provides a native oxide surface which reduces the surface state density and increases the storage time of minority carriers near the surface.

The resulting native oxide creates extremely low surface state densities which result in improved performance of mercury cadmium telluride infrared detectors. The ozone oxide also creates a low surface recombination velocity. This allows for improved performance of CCDs and photovoltaic diodes, which are sensitive to improperly passivated surfaces. A well-passivated surface prevents the loss or recombination of charge carriers, which comprise the information or signal that the device is carrying.

BRIEF DESCRIPTION OF THE DRAWING

The FIGURE depicts, partly schematically and partly in section, an example of apparatus suitably employed in the practice of the invention.

DETAILED DESCRIPTION OF THE INVENTION

Ozone has one of the highest oxidation potentials of any oxidizer and it reacts with all three elements of (Hg,Cd)Te. The tellurium oxidizes to $TeO_2$, which is very stable thermally. Mercury forms HgO, which decomposes at temperatures near 100° C. HgO may be partially stabilized in a matrix containing the other oxides. Ozone reacts with cadmium to form CdO plus some $CdO_2$. The latter oxide apparently decomposes readily to CdO and oxygen; while the former oxide is stable to over 1000° C.

The use of ozone to form the foregoing oxides is a clean, simple and reliable technique. The oxide growth is self-limiting in a water-free environment, and no energetic ions, electromagnetic radiation or heating is needed. In addition, ozone passivation appears to be compatible with a ZnS insulating overlayer.

The formation of a high quality native oxide requires careful preparation of the surface before the oxidation reaction occurs. Surface contamination by salts, particulates and oils must be removed without damaging the underlying semiconductor crystal with mechanical abrasion or with chemicals that might diffuse through several atomic layers of the surface and change the compensation of the semiconductor surface. The ozone-produced native oxide layer provides a barrier which seals these contaminants away from the electrically active semiconductor surface. However, they must be removed from the $Hg_{1-x}Cd_xTe$ surface before the ozone grows the oxide film.

When ozone oxidizes, only one atom of oxygen is released to do the oxidation, while an oxygen molecule is left as a by-product. The ozone molecule is believed to weakly adsorb to most surfaces. Then a charge transfer can take place which leaves the adsorbed species negative and a hole is injected into the valence band of the semiconductor. Only a very small percentage of the adsorbed ozone becomes charged, however. For oxidation of the surface to result, a chemical reaction must ensue. When an ozone molecule does dissociate, the atomic oxygen released presumably diffuses into the surface, partially driven by the negative charge in the adsorbed gas layer. It then bonds to the Hg, Cd and Te atoms to form an oxide. Once the oxide is thick enough, the electric field formed across the oxide becomes too weak to propel the oxygen ions and the oxide stops growing. This occurs on Hg,Cd)Te at an oxide thickness of about 30 Å.

Equipment suitable for use in generating ozone and oxidizing (Hg,Cd)Te is shown schematically in the FIGURE. Ultrahigh purity (UHP) oxygen, contained in source 10, is metered through a flowmeter 12 into an ozone generator 14. The ozone generator may be any generator commerically available in the art. For exemplary purposes, the ozone generator depicted in the FIGURE comprises a Pyrex glass condenser tube 16 filled with a saturated aqueous solution of sodium bicarbonate ($NaHCO_3$) 18 into which is inserted a copper wire inner electrode 20, which is connected to one output tap of a high voltage transformer 22. Conveniently, a high voltage neon sign transformer, capable of supplying on the order of $10^4$ volts at 60 Hz, is employed. A metallic outer electrode 24, such as aluminum foil or silver coating, is connected to the other output tap of the transformer. Oxygen enters the ozone generator at inlet 26. When the electrodes are energized with high voltage from the transformer, ozone is produced, which exits as a mixture of ozone and oxygen at outlet 28. The ozone/oxygen mixture is then introduced into a reaction chamber 30 in which is supported a substrate 32 maintained in position by support 34. At least the surface of the substrate comprises mercury cadmium telluride, which is to be oxidized.

The ozone concentration is conveniently altered by either changing gas flow rates or, more conveniently, by employing a variable transformer so that the high voltage may be controllably adjusted.

It is important to minimize both water vapor (e.g., less than about 3 ppm) and nitrogen in the oxygen. Water vapor in ozone results in difficulties relating to growth of the oxide, as described below. The presence of nitrogen leads to the formation of oxides of nitrogen, while the presence of both water vapor and nitrogen lead to the formation of nitric acid, all of which deplete the available ozone.

A generator such as that described above is capable of providing an ozone concentration of about 0.3 to 0.6 vol/vol percent of $O_3$ in $O_2$. Commercial generators are capable of providing ozone concentrations of about 6 to 8 vol/vol percent and may be alternatively employed.

The ozone output of the generator is readily and conveniently determined by bubbling the gas mixture through a solution of potassium iodide. This oxidizes the iodide quantitatively to iodine by the following reaction:

$$2KI + O_3 + H_2O = I_2 + 2KOH + O_2.$$

After passing a measured amount of gas through the iodide solution, the iodine formed is titrated with sodium thiosulfate as shown in the following reaction:

$$I_2 + 2Na_2S_2O_3 = 2NaI = Na_2S_4O_6.$$

The iodide solution is unbuffered and 0.2 M in strength. The thiosulfate is 0.05 N. Since one mole of iodine reacts with 2 moles of $Na_2S_2O_3.5H_2O$, it is possible to calculate the ozone concentration (in vol/vol percent) by determining how much iodine was formed.

The foregoing ozone oxidation is suitably employed for the entire range of compositions from HgTe to CdTe. Thus, the value of x in $Hg_{1-x}Cd_xTe$ ranges from 0 to 1. In devices of commercial interest; x ranges from about 0.15 to 0.4; accordingly, this is the preferred range for x.

Employing the dry ozone oxidation described above, an oxide thickness of about 15 to 20 Å is formed very quickly and then grows extremely slowly afterward. This self-limiting behavior is typical of natural passivation films; they passivate their own growth reaction. This is in contrast to oxides formed from oxone dissolved in water ("wet" ozone), which continues to attack the surface of (Hg,Cd)Te, and is thus to be avoided. The wet oxide contains defects which allow migration of the oxidation and/or oxidizable species, which show up in electronic tests of the oxide as increased hysteresis in capacitance-voltage (C-V) curves and large negative flatband shifts, both of which are undesirable.

The reaction is carried out at ambient temperature, typically within about 10° C. of room temperature. Higher temperatures apparently cause a degradation in the ozone oxidation process and should thus be avoided.

The ozone concentration in the ozone/oxygen mixture is at least that effective to cause formation of a native oxide film on the mercury cadmium telluride surface within a reasonable period of time. Considerations of both reaction time and no further improvement above a certain level of ozone concentration appear to indicate an effective range of about 0.3 to 3 vol/vol percent of ozone in the $O_3/O_2$ mixture. Preferably, a range of about 1 to 2 vol/vol percent of ozone is employed.

The reaction time is at least about 15 minutes; longer periods of time are largely dictated by economic considerations. A period of about 90 minutes is sufficient to ensure virtually complete passivation.

EXAMPLES

A number of experiments were run, employing apparatus depicted similar to that in the FIGURE to form a native oxide on $Hg_{1-x}Cd_xTe$ substrates. The semiconductor surfaces (x=0.3) were cleaned by various cleaning procedures, which apparently had no significant effect on the test results. Following cleaning, the substrates were placed in the reaction chamber. Voltage, typically 10,000 to 12,000 V at 60 Hz, was applied to the ozone generator. UHP oxygen (<3 ppm $H_2O$) was flowed through the system at about 0.17 l/min. The process was carried out at room temperature for periods of time ranging from 15 to 240 min. For comparison, wet ozone (ozone dissolved in water; saturated solution of a mixture comprising 1 vol/vol percent of $O_3$ in $O_2$), anodization and ambient air ("bare") were used to form different native oxides. Table I lists the type of material, the period of reaction time and type of ozone (wet or dry), the refractive index of the native oxide formed and its thickness. The thickness of the oxide film was determined by ellipsometry. A computer program was used to calculate the refractive index and oxide thickness from the optical data provided by ellipsometry. The refractive index for ozone oxide films was close to the value of 2.2 estimated to represent a fully oxidized (Hg,Cd)Te layer. The estimate was based on the bulk optical properties of HgO, CdO and $TeO_2$.

Following ozonation to form a passivated surface, the sample was coated with 6,000 Å of thermally evaporated ZnS to provide a thicker insulator for metal-insulator-semiconductor (MIS) tests by the capacitance-voltage (C-V) method. The quality of this ZnS layer is important for obtaining good electronic data about the ozone passivation. Shown in Table II for each experiment are the hysteresis at sweep voltage in volts, the flatband voltage in volts, the storage time in milliseconds at the specific bias listed in volts, the surface recombination velocity in centimeters per second and the surface state density, $N_{ss}$, in $cm^{-2} eV^{-1}$.

As can be seen from Table II, the process of the invention yields desirably low values for the surface recombination velocity and for the surface state density.

TABLE I
OZONATION PARAMETERS AND RESULTS

| EXPERIMENT | MATERIAL TYPE | DURATION (min) AND TYPE OF OZONE | REFRACTIVE INDEX OF FILM | THICKNESS OF FILM (Å) |
|---|---|---|---|---|
| 1 | n (some p) | 30 DRY | 2.55 | 12 |
| 2 | n | 30 WET | 2.2 | 33 |
| 3 | n | 180 DRY | 2.8 | 17 |
| 4 | n | 90 DRY | 2.6 | 17 |
| 5 | n | 90 WET | 2.33 | 175 |
| 6A | n | 30 DRY | 2.05 | 14 |
| 6B | n | ANODIZED | | 56 |
| 6C | n | 40 WET | 2.4 | |
| 7A | n | 90 DRY | 2.25 | 17 |
| 7B | n | 90 WET | 2.5 | 190 |
| 8A | n | 90 DRY | 2.35 | 14 |
| 8B | n | 30 WET | 2.67 | 34 |
| 8C | n | BARE | — | — |
| 8D | n | 15 WET | 3.1 | 25 |
| 9A | n | 30 DRY | 2.35 | 18 |
| 9B | p | 90 DRY | 2.55 | 19 |
| 9C | p | 15 WET | 2.37 | 30 |

TABLE I-continued
OZONATION PARAMETERS AND RESULTS

| EXPERIMENT | MATERIAL TYPE | DURATION (min) AND TYPE OF OZONE | REFRACTIVE INDEX OF FILM | THICKNESS OF FILM (Å) |
|---|---|---|---|---|
| 9D | n | BARE | — | — |
| 10A | n | 15 DRY | 2.55 | 17 |
| 10B | p | 30 DRY | 2.5 | 62 |
| 10C | n | 60 DRY | 2.4(K = 0.5) | 45 |
| 10D | n | 120 DRY | 2.4(K = 0.5) | 20 |
| 10E | n | 240 DRY | 2.4(K = 0.6) | 19 |
| 11A | n | 30 DRY | 2.7 | 17 |
| 11B | n | 90 DRY | 2.7 | 18 |
| 11C | n | 15 WET | 2.5 | 23 |
| 11D | n | BARE | — | — |
| 12A | n | 30 DRY | 2.9 | 23 |
| 12B | n | 90 DRY | 2.85 | 26 |
| 12C | n | 180 DRY | 2.7 | 21 |
| 12D | n | BARE | — | — |
| 13, x = 0 | n | 90 DRY | 2.8 | 14 |
| 14, x = 1 | * | 90 DRY | 2.55 | 25 |

*Semi-insulating

TABLE II
ELECTRICAL PROPERTIES

| EXPERIMENT | HYSTERESIS AT SWEEP VOLTAGE (volts) | FLATBAND VOLTAGE (volts) | STORAGE TIME (msec) AT BIAS (volts) | SURFACE RECOMBINATION VELOCITY (cm/sec) | SURFACE STATE DENSITY ($cm^{-2}eV^{-1}$) |
|---|---|---|---|---|---|
| 1 | 0.05 at ±2 | −1 | 0 | — | — |
| 2 | 0.30 at ±2 | −0.8 to −1.2 | 110 at ? | — | — |
| 3 | 1.5 at ±7 Probe Data | −3.5 Probe Data | — | — | — |
| 4 | 3.1 at ±6 Probed | −3.5 Probed | — | — | — |
| 5 | 8.6 at ±11 | −9 Probed | | | |
| 6A | 0.5 at ±2.5 | −1.25 | *800 at −1 to −2; *15 at −2 to −3; *0 below −3 | — | $3 \times 10^{11}$ |
| 6B | | | | | |
| 6C | 0.5 at ±2.5 | −1.5 | 0 | — | — |
| 7A | 0.4 at ±3.5 | 0 | *600 at −1 to −2; *300 at −2 to −3; 20 at −3 to −4; 5 at −4 to −5 | 10 at −1 to −2V; 500 at −2 to −3V | — |
| 7B | 0.7 at ±2 | −1 | *10 at −2 to −6 | — | — |
| 8A | 0.25 at ±0.3 | 9 +0.3 | | — | $1 \times 10^{11}$ |
| 8B | 0.25 at ±2 | −0.1 | | — | |
| 8C | 0.25 at ±2 | +0.5 | | — | |
| 8D | 0.15 at ±2 | +0.2 | 3 at −4 to −5 | — | $1 \times 10^{11}$ |
| 9A | 0.0 at ±2.5 | −0.45 | 0 | — | |
| 9B | 0.03 at ±2.5 | −0.5 | 0 | — | |
| 9C | 0.2 at ±10.0 | −1.2 | 0 | — | |
| 9D | 0.5 at ±6 | −0.2 | 0 | — | |
| 10A | 0.2 at ±3 | +3.0 | 0 | — | |
| 10B | 0.25 at ±6 | 11 +1.0 | 0 | — | |
| 10C | 0.1 at ±3 | +1.8 | 0 | — | |
| 10D | 0.9 at ±13 | +2.5 | 0 | — | |
| 10E | 0.15 at ±5 | +0.6 | 0 | — | |
| 11A | 0 to 0.1 at ±10 | −1.0 | *2 at −1 to −3 | — | $2 \times 10^{11}$ |
| 11B | 0.2 at ±8 | −1.0 | 8 at −8 to −10; 3 at −18 to −20 | — | — |
| 11C | 0.9 at ±4 | −1.5 | 3 at −8 to −10 | — | ~$1 \times 10^{11}$ |
| 11D | 0.15 at ±4 | −0.2 | 1.5 at −2 to −4 | — | $2 \times 10^{11}$ |
| 12A | 0.25 at ±4 | −0.1 to ±0.3 | 24 at −2 to −4; 18 at −8 to −10 | — | $3 \times 10^{10}$ |
| 12B | 0.15 at ±3 | 0 to ±0.3 | 0 | — | $6 \times 10^{10}$ |
| 12C | 0.15 at ±3.5 | −0.2 | 0 | — | — |
| 12D | 0.25 at ±4 | 0 to +0.5 | 0 | — | — |

*Storage time questionable due to hysteresis

What is claimed is:

1. A process for forming a native oxide on a semiconductor surface comprising $Hg_{1-x}Cd_xTe$, where x ranges from 0 to 1, which comprises exposing the semiconductor surface to a substantially water-free mixture of ozone and oxygen containing at least about 0.3 vol/vol percent ozone, said process carried out at a temperature within about ±10° C. of ambient temperature.

2. The process of claim 1 in which x ranges from about 0.15 to 0.4.

3. The process of claim 1 in which the ozone concentration ranges from about 0.3 to 3 vol/vol percent.

4. The process of claim 3 in which the ozone concentration ranges from about 1 to 2 vol/vol percent.

5. The process of claim 1 carried out at ambient temperature.

6. The process of claim 1 in which the semiconductor surface is exposed to the ozone/oxygen mixture for a period of time of least about 15 minutes.

7. The process of claim 6 in which the period of time is about 90 minutes.

* * * * *